United States Patent
Kojima

(10) Patent No.: US 8,030,965 B2
(45) Date of Patent: *Oct. 4, 2011

(54) LEVEL SHIFTER USING SR-FLIP FLOP

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/635,518

(22) Filed: Dec. 10, 2009

(65) Prior Publication Data

US 2011/0140750 A1   Jun. 16, 2011

(51) Int. Cl.
*H03K 19/0175* (2006.01)
(52) U.S. Cl. .................. 326/81; 326/68; 326/80
(58) Field of Classification Search .......... 326/62, 326/68, 80–81; 327/333
See application file for complete search history.

(56) References Cited

U.S. PATENT DOCUMENTS

| | | | | |
|---|---|---|---|---|
| 6,043,698 A | * | 3/2000 | Hill | 327/333 |
| 6,043,699 A | | 3/2000 | Shimizu | 327/333 |
| 6,600,357 B1 | | 7/2003 | Kirihara | 327/333 |
| 7,852,119 B1 | * | 12/2010 | Kojima | 326/81 |
| 2005/0285658 A1 | * | 12/2005 | Schulmeyer et al. | 327/333 |
| 2009/0002027 A1 | * | 1/2009 | Lee | 326/80 |

* cited by examiner

*Primary Examiner* — Anh Tran
(74) *Attorney, Agent, or Firm* — Ladas & Parry, LLP

(57) ABSTRACT

A level shifter receives an input signal of either a first lower voltage or a first upper voltage which form a voltage pair, and level-shifts the input signal to output an output signal of either a second lower voltage or a second upper voltage. An SR flip-flop generates an output signal which is switched to the second upper voltage upon receiving a positive edge via its set terminal, and is switched to the second lower voltage upon receiving a positive edge via its reset terminal. An AND gate generates the logical AND of a feedback signal having the inverted logical level of the output signal of the SR flip-flop and the input signal, which is output to the set terminal of the SR flip-flop. A NOR gate generates the logical NOR of the feedback signal and the input signal, which is output to the reset terminal of the SR flip-flop.

16 Claims, 12 Drawing Sheets

LEVEL SHIFTER USING SR-FLIP FLOP

BACKGROUND OF THE INVENTION

1. Field of the Invention

The present invention relates to a level shifter.

2. Description of the Related Art

With a semiconductor circuit having multiple circuit blocks, in some cases, there is a difference in the operating voltage level between such multiple circuit blocks. For example, in a case in which one circuit block is configured as a 3.5-V system, and another circuit block is configured as a 1.5-V system. In this case, there is a need to provide a level shifter as an interface between the circuit blocks so as to shift the voltage level of signals transmitted across the interface.

RELATED ART DOCUMENTS

Patent Documents

[Patent Document 1]
U.S. Pat. No. 6,043,699 Specification
[Patent Document 2]
U.S. Pat. No. 6,600,357 B1 Specification In digital circuits, SR flip-flops are employed as principal components. Accordingly, a level shifter configured employing such SR flip-flops is convenient from the perspective of designing a circuit.

SUMMARY OF THE INVENTION

The present invention has been made in view of such a situation. Accordingly it is an exemplary purpose of an embodiment of the present invention to provide a level shifter configured employing SR flip-flops.

An embodiment of the present invention relates to a level shifter configured to receive an input signal having a level set to one from among a first lower voltage and a first upper voltage which form a voltage pair, and to level-shift the input signal thus received so as to output an output signal having a level set to one from among a second lower voltage and a second upper voltage. The level shifter comprises: an SR flip-flop configured to generate an output signal which is switched to the second upper voltage upon receiving a positive edge of a signal via a set terminal thereof, and which is switched to the second lower voltage upon receiving a positive edge of a signal via a reset terminal thereof; a first logical gate configured to generate the logical AND of a feedback signal having the inverted logical level of the output signal of the SR flip-flop and the input signal, and to output the logical AND thus generated to the set terminal of the SR flip-flop; and a second logical gate configured to generate the logical NOR of the feedback signal and the input signal, and to output the logical NOR thus generated to the reset terminal of the SR flip-flop.

With such an embodiment, the SR flip-flop is switched between the set state and the reset state according to the result of the logical operation obtained based upon the output signal or the inverted output signal and the input signal. As a result, such an arrangement generates the output signal which is switched synchronously with each positive edge and each negative edge of the input signal. Furthermore, such an arrangement is capable of level-shifting the output signal.

In a case in which the SR flip-flop includes an inverting set terminal, the first logical gate may generate the logical NAND of the feedback signal and the input signal. In a case in which the SR flip-flop includes an inverting reset terminal, the second logical gate may generate the logical OR of the feedback signal and the input signal.

Also, a level shifter according to an embodiment may further comprise Schmitt buffer or a delay circuit configured to receive the inverted output signal of the SR flip-flop, and to generate the feedback signal.

Such an arrangement including such a Schmitt buffer or a delay circuit ensures that the circuit operates more reliably even if the change in the input signal is slow.

A level shifter according to an embodiment may further comprise a Schmitt inverter configured to receive the output signal of the SR flip-flop, and to generate the feedback signal.

Another embodiment of the present invention also relates to a level shifter. The level shifter comprises: an inverter configured to receive a first lower voltage and a first upper voltage as a power supply voltage, and to invert the input signal; and an SR flip-flop configured to receive the input signal via the set terminal thereof, to receive, via the reset terminal thereof, the inverted input signal thus inverted by the inverter, and to generate an output signal which is switched to a second upper voltage upon receiving a positive edge of the signal via the set terminal thereof, and which is switched to a second lower voltage upon receiving a positive edge of the signal via the reset terminal thereof.

With such an embodiment, upon receiving a positive edge of the input signal, the SR flip-flop is set, thereby outputting the output signal at a high level. Upon receiving a negative edge of the input signal, the SR flip-flop is reset, thereby outputting the output signal at a low level. That is to say, such an arrangement generates the output signal which is switched synchronously with each positive edge and each negative edge of the input signal. Furthermore, such an arrangement is capable of level-shifting the output signal.

In a case in which the SR flip-flop includes an inverting set terminal, or in a case in which the SR flip-flop includes an inverting reset terminal, the signal logically inverted as appropriate by an inverter may be supplied to the SR flip-flop.

Yet another embodiment of the present invention relates to a test apparatus. The test apparatus comprises: a first circuit block configured to operate by receiving a first lower voltage and a first upper voltage, which form a voltage pair; a second circuit block configured to operate by receiving a second lower voltage and a second upper voltage, which form a voltage pair; and a level shifter according to any one of the above-described embodiments, configured to receive a signal output from the first circuit block, and to transmit the signal thus received to the second circuit block.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
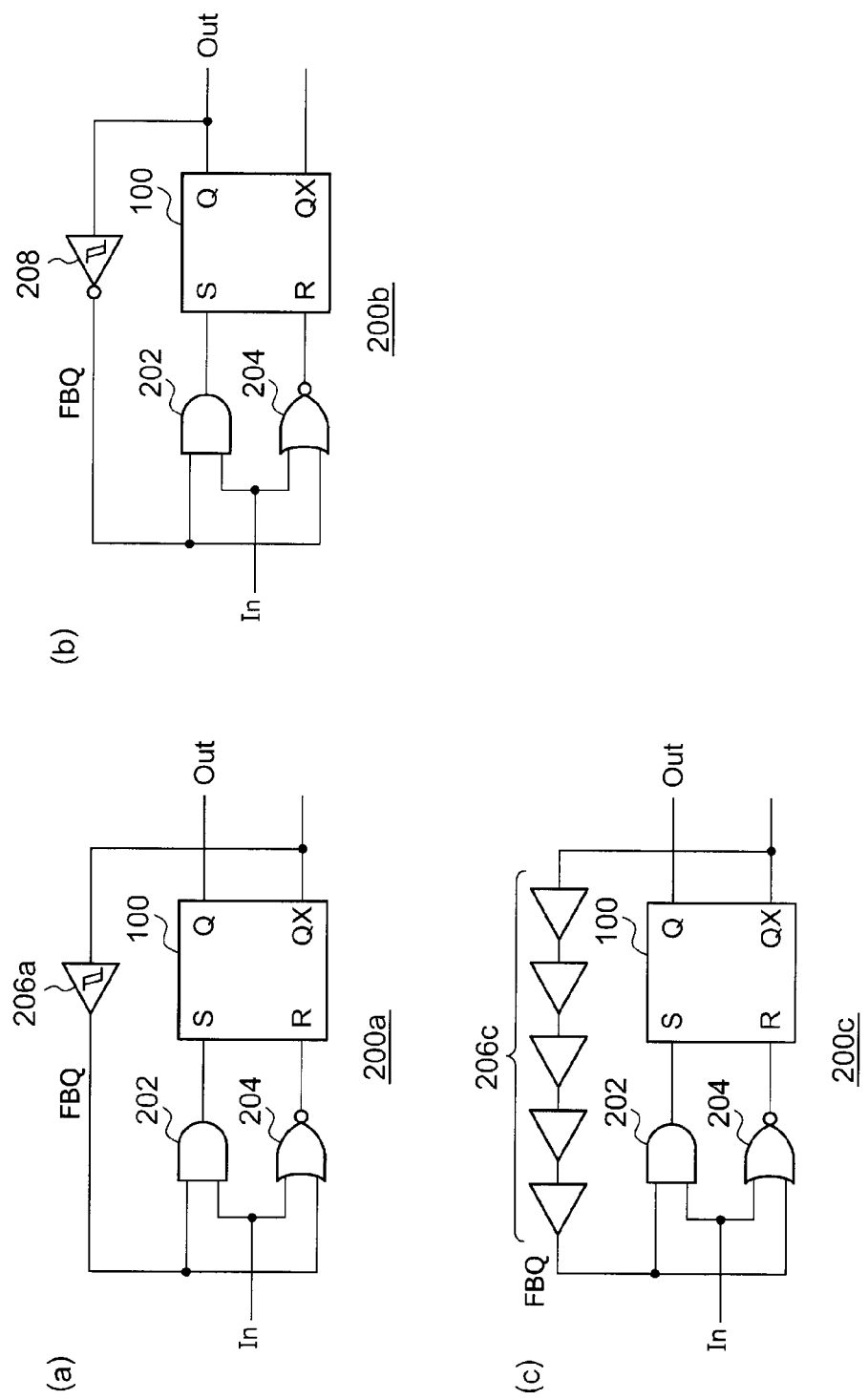
FIGS. 1A through 1C are circuit diagrams which show a configuration of a level shifter according to an embodiment.

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

FIGS. 1A through 1C are circuit diagrams which show the configurations of the level shifter 200. The level shifters 200a, 200b, and 200c (which will be collectively referred to as the "level shifter 200" hereafter) shown in FIGS. 1A through 1C receive an input signal In which is set to either the level of the first lower voltage VssL or the level of the first upper voltage VddL, which form a voltage pair. Furthermore, the level shifter 200 level-shifts the input signal In so as to generate the output signal Out which is set to either the level of the second lower voltage VssH or the level of the second upper voltage VddH, which form a voltage pair.

The level shifters 200a shown in FIG. 1A includes the SR flip-flop 100, a first logical gate (AND gate) 202, and a second logical gate (NOR gate) 204.

The SR flip-flop 100 includes a set terminal and a reset terminal. The SR flip-flop 100 generates an output signal Out, which is switched to the second upper voltage VddH upon receiving a positive edge of the signal via the set terminal, and which is switched to the second lower voltage VssH upon receiving a positive edge of the signal via the reset terminal. Description will be made later regarding an example configuration of the SR flip-flop 100.

The AND gate 202 generates the logical AND of the input signal In and a feedback signal FBQ which has the inverted logical level of the output signal Q (Out) of the SR flip-flop 100, i.e., the same logical level as that of the inverted output signal QX, and outputs the logical AND thus generated to the set terminal of the SR flip-flop 100. Furthermore, the NOR gate 204 generates the logical NOR of the feedback signal FBQ and the input signal In, and outputs the logical NOR thus generated to the reset terminal of the SR flip-flop 100.

The level shifter 200a shown in FIG. 1A includes a Schmitt buffer 206a. The Schmitt buffer 206a receives the inverted output signal QX, and generates the feedback signal FBQ. By employing the Schmitt buffer 206a, such an arrangement ensures that the circuit operates reliably even if the change in the input signal In is slow. In a case in which the input signal In is switched at a sufficiently high speed, a simple buffer may be employed.

The above is the basic configuration of the level shifter 200 according to the embodiment. FIGS. 1B and 1C show modifications of the level shifter 200 shown in FIG. 1A.

The level shifter 200b shown in FIG. 1B includes a Schmitt inverter 208, instead of the Schmitt buffer 206a shown in FIG. 1A. The Schmitt inverter 208 receives the output of the first inverter 32 of the SR flip-flop 100, i.e., the output signal Q, and generates the feedback signal FBQ. By employing the Schmitt inverter 208, such an arrangement ensures that the circuit operates reliably as compared with an arrangement employing an ordinary inverter.

The level shifter 200c shown in FIG. 1C includes a delay circuit 206c, instead of the Schmitt buffer 206a shown in FIG. 1A. The delay circuit 206c receives the inverted output signal QX, and applies a predetermined delay to the inverted output signal QX thus received. Such an arrangement employing the delay circuit 206c ensures that the circuit operates reliably as compared with an arrangement employing a simple buffer.

Figure 2:
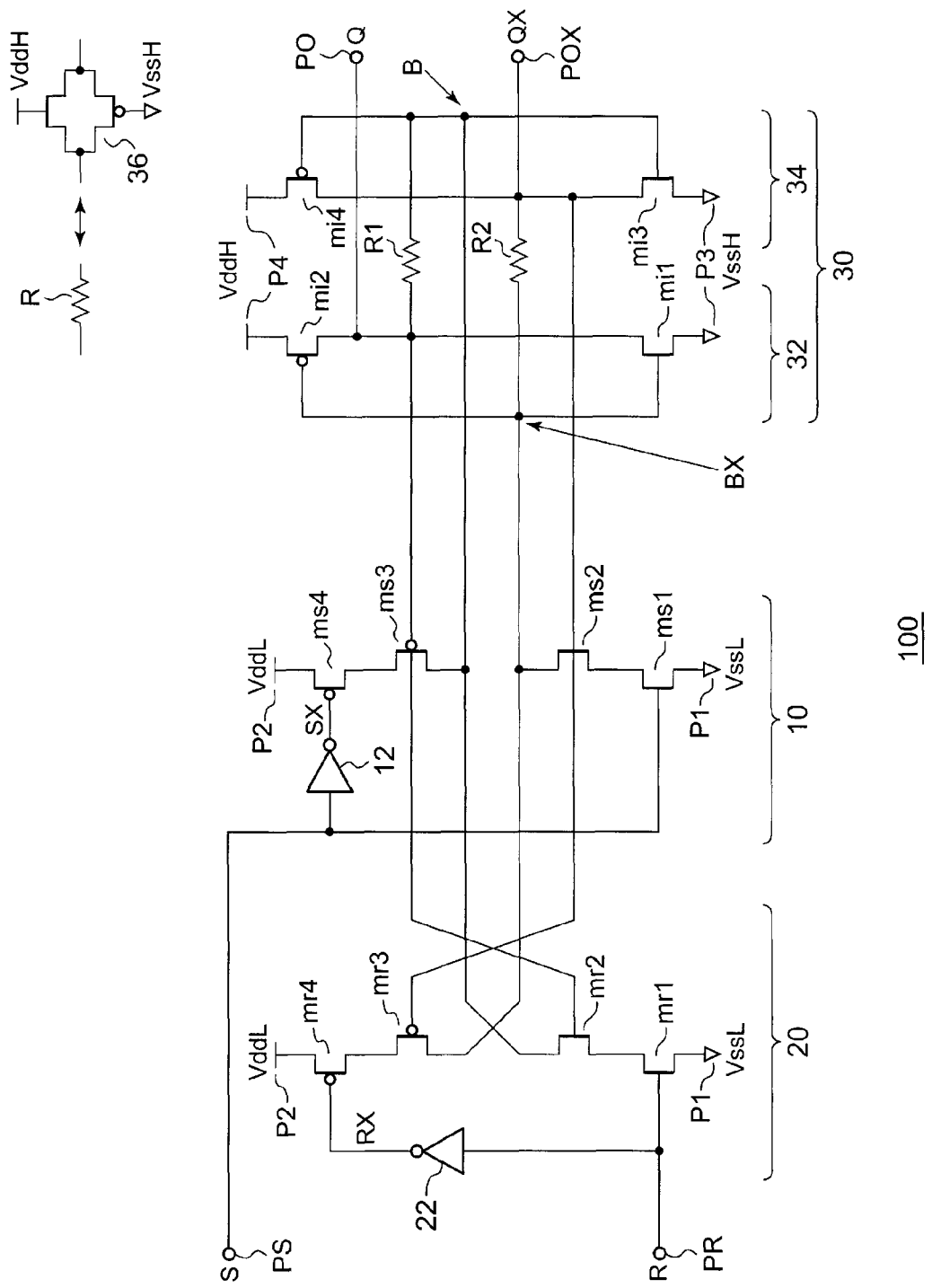
FIG. 2 is a circuit diagram which shows a configuration of an SR flip-flop having a function as a level shifter which can be employed in the level shifter circuit shown in FIGS. 1A through 1C.

FIG. 2 is a circuit diagram which shows a configuration of the SR flip-flop 100 having a function as a level shifter which can be used as the level shifter circuit shown in FIG. 1. It should be noted that the configuration of the SR flip-flop 100 is not restricted to such an arrangement shown in FIG. 2. Also, various flip-flops having the same functions and different configurations may be employed.

The SR flip-flop 100 receives a set signal S and a reset signal R, generates an output signal Q which is switched to a first level (VddH) in response to a positive edge of the set signal, and which is switched to a second level (VssH) in response to a positive edge of the reset signal, and outputs the output signal Q via an output terminal PO thereof. Furthermore, the SR flip-flop generates an inverted output signal QX having a signal level which is complementary to that of the output signal Q, and outputs the inverted output signal QX via an inverting output terminal POX thereof. In this specification, "X" indicates logical inversion.

The SR flip-flop 100 includes a first lower terminal P1, a first upper terminal P2, a second lower terminal P3, a second upper terminal P4, a set terminal PS, a reset terminal PR, an output terminal PO, an inverting output terminal POX, a set unit 10, a reset unit 20, and a cross-coupled inverter 30.

A first lower voltage VssL is applied to the first lower terminal P1. A first upper voltage VddL, which forms a pair with the first lower voltage VssL, is applied to the first upper terminal P2. A second lower voltage VssH is applied to the second lower terminal P3. A second upper voltage VddH, which forms a pair with the second lower voltage VssH, is applied to the second upper terminal P4.

Here, in order to provide normal operation of the SR flip-flop 100, the condition in which VssH<VssL<VddL<VddH is preferable.

A set signal S is input to the set terminal PS, and a reset signal R is input to the reset terminal PR.

The cross-coupled inverter 30 includes a first inverter 32 and a second inverter 34 arranged between the second lower terminal P3 and the second upper terminal P4. The first inverter 32 includes transistors mi1 and mi2, and the second inverter 34 includes transistors mi3 and mi4. The first inverter 32 and the second inverter 34 are cross-coupled such that the input terminal of each inverter is connected to the output terminal of the other inverter.

The set unit 10 includes a first set transistor ms1 through a fourth set transistor ms4. The first set transistor ms1 and the second set transistor ms2 are each N-channel MOSFETs, and are arranged in series in this order between the first lower terminal P1 and the input terminal of the first inverter 32. The third set transistor ms3 and the fourth set transistor ms4 are each P-channel MOSFETs, and are arranged in series in this order between the input terminal of the second inverter 34 and the first upper terminal P2.

The inverter 12 inverts the set signal S. The set signal S is input to the gate of the first set transistor ms1. A set signal SX, which is obtained by inverting the set signal S by the inverter 12, is input to the gate of the fourth set transistor ms4.

The reset unit 20 includes a first reset transistor mr1 through fourth reset transistor mr4. The first reset transistor mr1 and the second reset transistor mr2 are each N-channel MOSFETs, and are arranged in series in this order between the first lower terminal P1 and the input terminal of the second inverter 34. The third reset transistor mr3 and the fourth reset transistor mr4 are each P-channel MOSFETs, and are arranged in series in this order between the input terminal of the first inverter 32 and the first upper terminal P2.

The inverter 22 inverts the reset signal R. The reset signal R is input to the gate of the first reset transistor mr1. A complementary reset signal RX, which is complementary to the reset signal R, is input to the gate of the fourth reset transistor mr4.

The gate of the second set transistor ms2 and the gate of the third reset transistor mr3 are each connected to the output terminal of the second inverter 34. Furthermore, the gate of the third set transistor ms3 and the gate of the second reset transistor mr2 are each connected to the output terminal of the first inverter 32.

In a preferable arrangement, the cross-coupled inverter 30 includes a first impedance element R1 and a second impedance element R2. The first impedance element R1 is arranged between the output terminal of the first inverter and the input terminal of the second inverter 34. The second impedance element R2 is arranged between the output terminal of the second inverter 34 and the input terminal of the first inverter 32.

The first impedance element R1 and the second impedance element R2 are each resistor elements having the same resistance. By providing the first impedance element R1 and the second impedance element R2, such an arrangement reduces transient current that flows through the set unit 10 and the reset unit 20.

The resistances of the first impedance element R1 and the second impedance element R2 are preferably designed to be within a range from 1 kΩ to 1 MΩ. Where the resistance is set to an excessively high value, the operation speed of the cross-coupled inverter 30 becomes slow. Conversely, where the resistance is set to an excessively low value, the operation speed of the cross-coupled inverter 30 becomes fast, but such an arrangement leads to an increase in the transient power supply current that flows through the set unit 10 and the reset unit 20. By setting the resistance to a value in the aforementioned range, such an arrangement provides a balance between the operation speed and the transient power supply current, thereby providing suitable performance. In view of the device size of the SR flip-flop 100 to be integrated as a semiconductor integrated circuit, the resistance is preferably set to a value within a range from 10 kΩ to 100 kΩ.

As the first impedance element R1 and the second impedance element R2, a transfer gate 36 which is controlled so as to remain in the ON state may be employed, instead of such a resistance element. The transfer gate 36 is shown in the upper right of FIG. 2.

Alternatively, an arrangement may be made in which the first impedance element R1 and the second impedance element R2 are eliminated, and the drain resistances of the transistors mi1 through mi4 are set to a high value. For the same reasons noted above, these resistances are preferably designed to be within a range from 10 kΩ to 1 MΩ.

From another perspective, in a case in which the first impedance element R1 and the second impedance element R2 are eliminated, the drain resistances of the transistors mi1 through mi4, which form the cross-coupled inverter 30, are designed to be higher than those of the first through fourth set transistors ms1 through ms4 and the first through fourth reset transistors mr1 through mr4.

Figure 3:
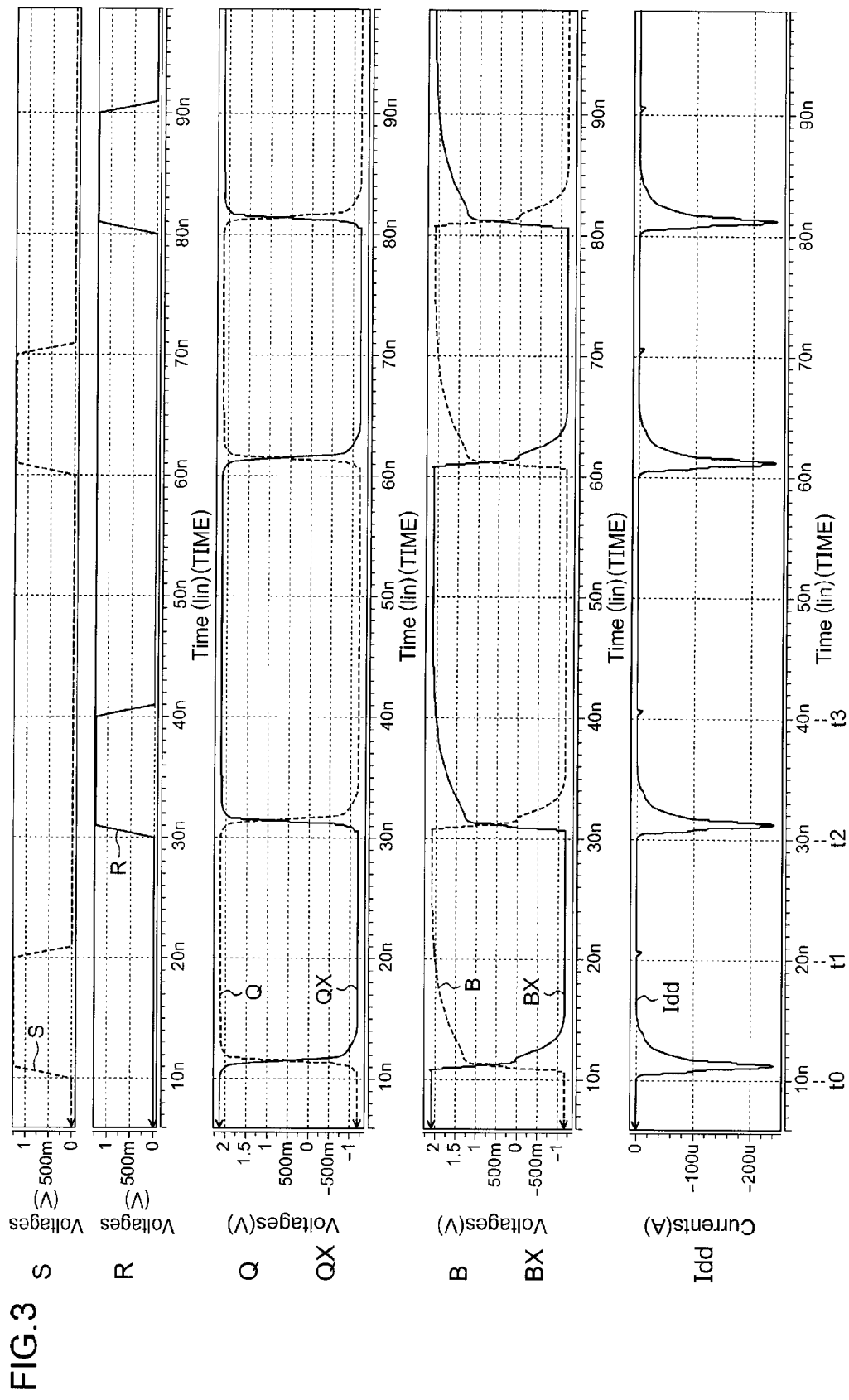
FIG. 3 is a time chart which shows the operation of the SR flip-flop shown in FIG. 2.

The above is the configuration of the SR flip-flop 100. Next, description will be made regarding the operation thereof. FIG. 3 is a time chart which shows the operation of the SR flip-flop 100 shown in FIG. 2. The time chart shows the set signal S, the reset signal R, the output signal Q, the inverted output signal QX, the input signal BX of the first inverter 32, the input signal B of the second inverter 34, and the current consumption Idd of the SR flip-flop 100, in this order, beginning from the top of the time chart.

The voltages VddL, VssL, VddH, and VssH are set to 1.2 V, 0 V, 2.1 V, and −1.2 V, respectively. Furthermore, the levels of the set signal S and the reset signal R are each switched at an arbitrary timing of a cycle of 10 ns. Let us consider a case in which, in the initial state before the time point t0, the signal levels of S, R, Q, and QX are VssL, VssL, VssH, and VddH, respectively. In this stage, let us say that the electric potential of the signal B is approximately the same as that of the signal Q, and the electric potential of the signal BX is approximately the same as that of the signal QX. Furthermore, the first reset transistor mr1 through fourth reset transistor mr4, and the first set transistor ms1 and the fourth set transistor ms4 are each set to the OFF state, and the second set transistor ms2 and the third set transistor ms3 are each set to the ON state.

At the time point t0, the set signal S switches to the high-level state. In this stage, the first set transistor ms1 through fourth set transistor ms4, which form the set unit 10, are each set to the ON state. This lowers the signal BX to the first lower voltage VssL, and raises the signal B to the first upper voltage VddL. When B exceeds BX, the state of the cross-coupled inverter 30 switches. In this state, the output signal Q approaches the second upper voltage VddH, and the inverted output signal QX approaches the second lower voltage VssH.

As a result, the second set transistor ms2 and the third set transistor ms3 are each switched to the OFF state.

Subsequently, at the time point t1, the set signal S switches to the low-level state. In this state, the first set transistor ms1 through fourth set transistor ms4, and the first reset transistor mr1 and the fourth reset transistor mr4 are each set to the OFF state. Furthermore, the second reset transistor mr2 and the third reset transistor mr3 are each set to the ON state. That is to say, the SR flip-flop 100 is set to a state opposite to that of the initial state.

Subsequently, at the time point t2, the reset signal R is switched to the high-level state. In this stage, the first reset transistor mr1 through fourth reset transistor mr4, which form the reset unit 20, are each set to the ON state. This raises the signal BX to the first upper voltage VddL, and lowers the signal B to the first lower voltage VssL. When B becomes smaller than BX, the state of the cross-coupled inverter 30 is switched. In this state, the output signal Q approaches the second lower voltage VssH, and the inverted output signal QX approaches the second upper voltage VddH. As a result, the second reset transistor mr2 and the third reset transistor mr3 are each set to the OFF state.

Subsequently, at the time point t3, the reset signal R is switched to the low-level state. In this state, the first reset transistor mr1 through fourth reset transistor mr4, and the first set transistor ms1 and the fourth set transistor ms4 are each set to the OFF state. Furthermore, the second set transistor ms2 and the third set transistor ms3 are each set to the ON state. That is to say, the SR flip-flop 100 is returned to the initial state.

The above is the operation of the SR flip-flop 100.

As described above, it can be understood that the circuit shown in FIG. 2 operates as an SR flip-flop. Furthermore, although the high level of each of the input signals S and R is VddL and the low level thereof is VssL, the high level of each of the output signals Q and QX is VddH and the low level thereof is VssH. Thus, it can be understood that the SR flip-flop 100 has a function as a level shifter which shifts the signal level in the amplitude direction.

Furthermore, as shown in the graph shown at the bottom of FIG. 3, it is noteworthy that the static state current consumption of such a circuit is almost zero, except for the positive edge timing of the set signal S or the reset signal R. This is because, in the static state, the switches connected in series between the upper voltage terminal and the lower voltage terminal are not set to the ON state at the same time. That is to say, in the static state, the relation that when one switch is set to the ON state, at least one of the other switches is set to the OFF state is satisfied.

Next, description will be made regarding a modification of the SR flip-flop 100 shown in FIG. 2. Description has been made regarding an arrangement in which the SR flip-flop 100 shown in FIG. 2 receives the set signal S and the reset signal R. Also, an arrangement may be made in which at least one of the set signal S and the reset signal R is logically inverted. In this case, the configuration of the set unit 10 and/or the reset unit 20 should be modified as follows.

Figure 4:
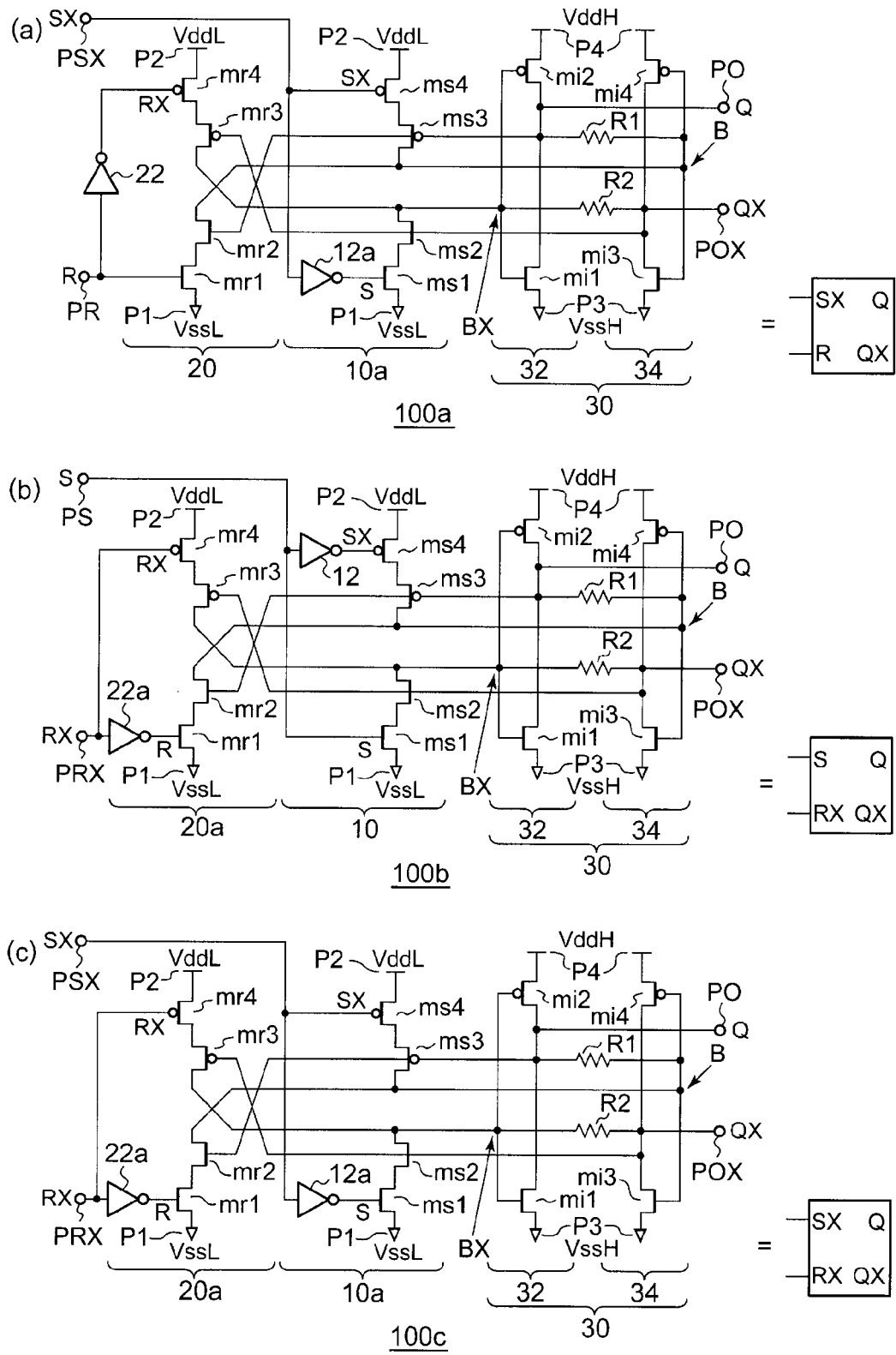
FIGS. 4A through 4C are circuit diagrams which show modifications of the SR flip-flop shown in FIG. 2.

FIGS. 4A through 4C are circuit diagrams which show modifications of the SR flip-flop 100 shown in FIG. 2. Circuit symbols thereof are shown to the right of each drawing.

FIG. 4A shows a modification in which an SR flip-flop 100a receives an inverted set signal SX via an inverting set terminal PSX, and receives a reset signal R via a reset terminal PR. That is to say, upon receiving a negative edge of the inverted set signal SX, the SR flip-flop 100a is set. Upon receiving a positive edge of the reset signal R, the SR flip-flop 100a is reset.

In a set unit 10a, the inverted set signal SX is directly input to the gate of the fourth set transistor ms4. Furthermore, the inverted set signal SX is logically inverted by an inverter 12a so as to generate the set signal S. The set signal S thus generated is input to the gate of the first set transistor ms1.

FIG. 4B shows a modification in which an SR flip-flop 100b receives a set signal S via a set terminal PS, and receives an inverted reset signal RX via an inverting reset terminal PRX. That is to say, upon receiving a positive edge of the set signal S, the SR flip-flop 100b is set. Upon receiving a negative edge of the inverted reset signal RX, the SR flip-flop 100b is reset.

In a reset unit 20a, the inverted reset signal RX is directly input to the gate of the fourth reset transistor mr4. Furthermore, the inverted reset signal RX is logically inverted by an inverter 22a so as to generate the reset signal R. The reset signal R thus generated is input to the gate of the first reset transistor mr1.

FIG. 4C shows a modification in which an SR flip-flop 100c receives an inverted set signal SX via an inverting set terminal PSX, and receives an inverted reset signal RX via an inverting reset terminal PRX. That is to say, upon receiving a negative edge of the inverted set signal SX, the SR flip-flop 100c is set. Upon receiving a negative edge of the inverted reset signal RX, the SR flip-flop 100c is reset. In this case, the set unit 10a should be combined with the reset unit 20a.

Also, for each of the arrangements shown in FIGS. 1A through 1C, the following modification may be made by replacing the SR flip-flop 100 with any one of the SR flip-flops shown in FIG. 4A through 4C.

Modification 1. In a case in which the SR flip-flop 100a shown in FIG. 4A is employed, the AND gate 202 should be replaced by a NAND gate 203.

Modification 2. In a case in which the SR flip-flop 100b shown in FIG. 4B is employed, the NOR gate 204 should be replaced by an OR gate 205.

Modification 3. In a case in which the SR flip-flop 100c shown in FIG. 4C is employed, the AND gate 202 should be replaced by the NAND gate 203, and the NOR gate 204 should be replaced by the OR gate 205.

Figure 5:
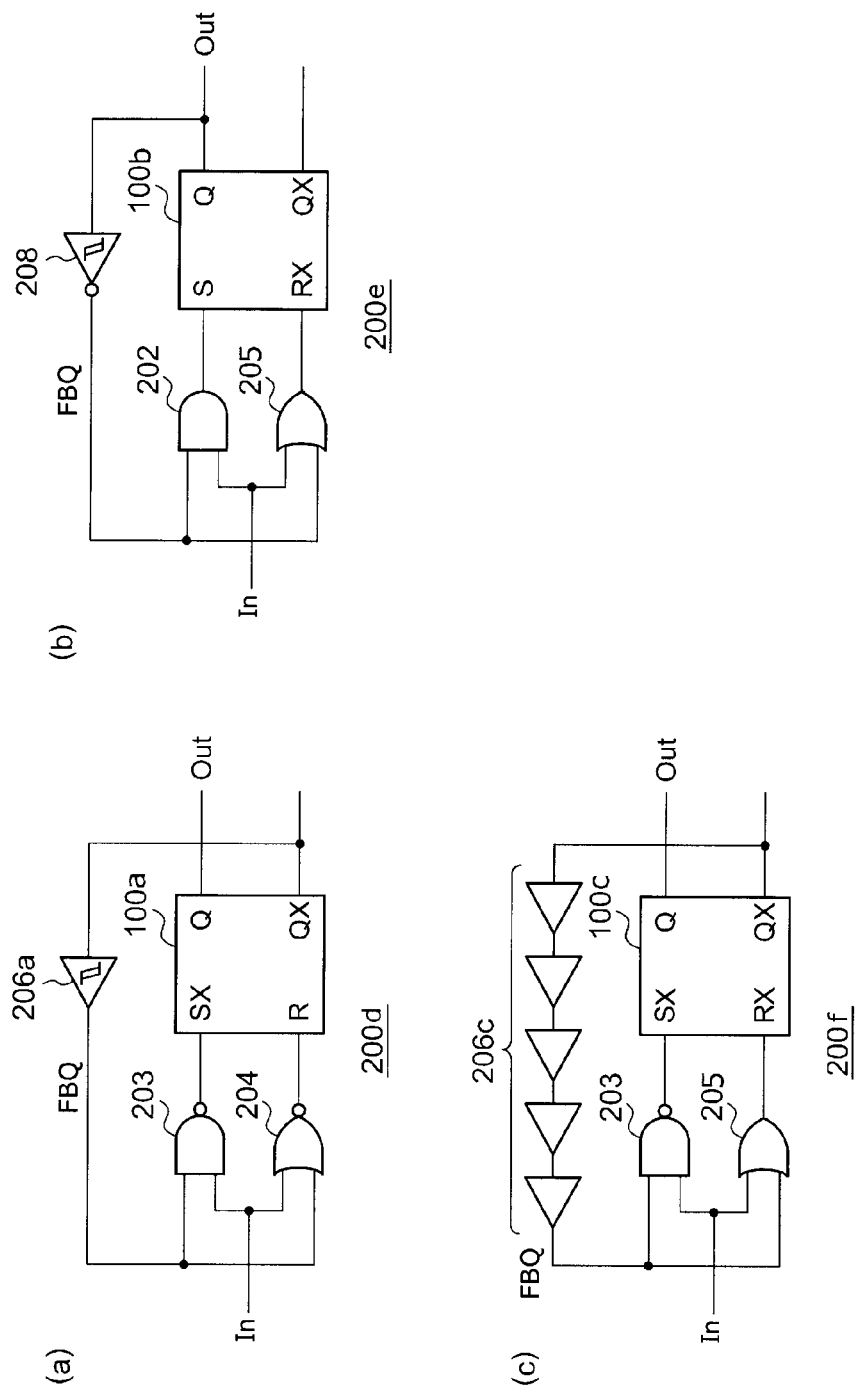
FIGS. 5A through 5C are circuit diagrams each of which shows the configuration of a level shifter according to a modification.

FIGS. 5A through 5C are circuit diagrams each of which shows the configuration of the level shifter 200 according to a modification.

A level shifter 200d shown in FIG. 5A is a modification 1 in which the SR flip-flop 100a shown in FIG. 4A is employed in the level shifter 200a shown in FIG. 1A.

A level shifter 200e shown in FIG. 5B is a modification 2 in which the SR flip-flop 100b shown in FIG. 4B is employed in the level shifter 200b shown in FIG. 1B.

A level shifter 200f shown in FIG. 5C is a modification 3 in which the SR flip-flop 100c shown in FIG. 4C is employed in the level shifter 200c shown in FIG. 1C.

A desired combination may be made using any one of the level shifters shown in FIGS. 1A through 1C and any one of the SR flip-flops shown in FIGS. 4A through 4C. Any combination thereof is encompassed in the scope of the present invention.

Figure 6:
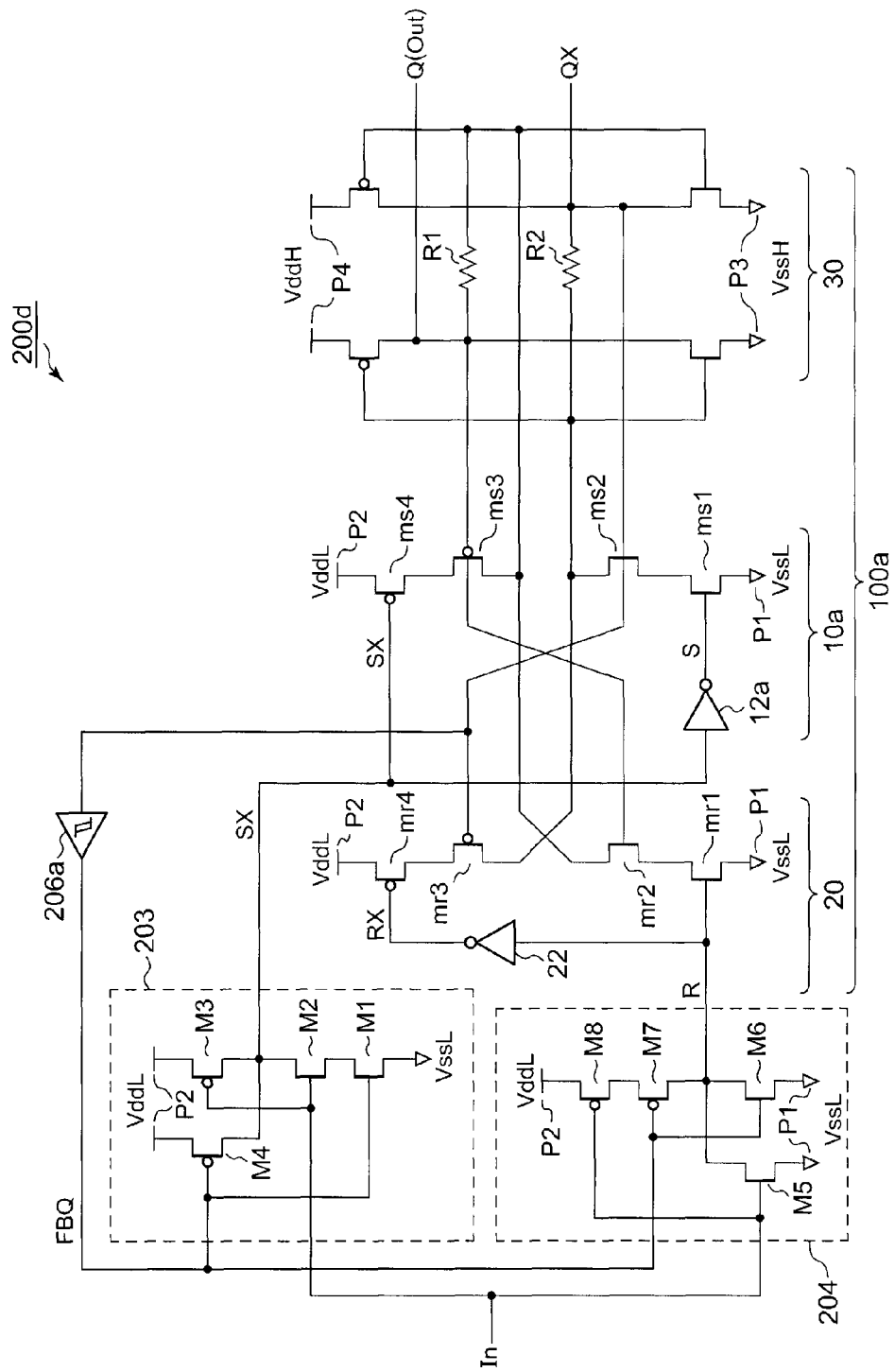
FIG. 6 is a circuit diagram which shows a specific configuration of the level shifter shown in FIG. 5A.

FIG. 6 is a circuit diagram which shows a specific configuration of the level shifter 200d shown in FIG. 5A. The level shifter 200d includes a NAND gate 203, a NOR gate 204, and the SR flip-flop 100a shown in FIG. 4A.

The NAND gate 203 includes a first transistor M1 through fourth transistor M4. Furthermore, the NOR gate 204 includes a fifth transistor M5 through eighth transistor M8. It should be noted that the configuration of the NAND gate and the NOR gate is not restricted to such a configuration shown in FIG. 6.

Figure 7:
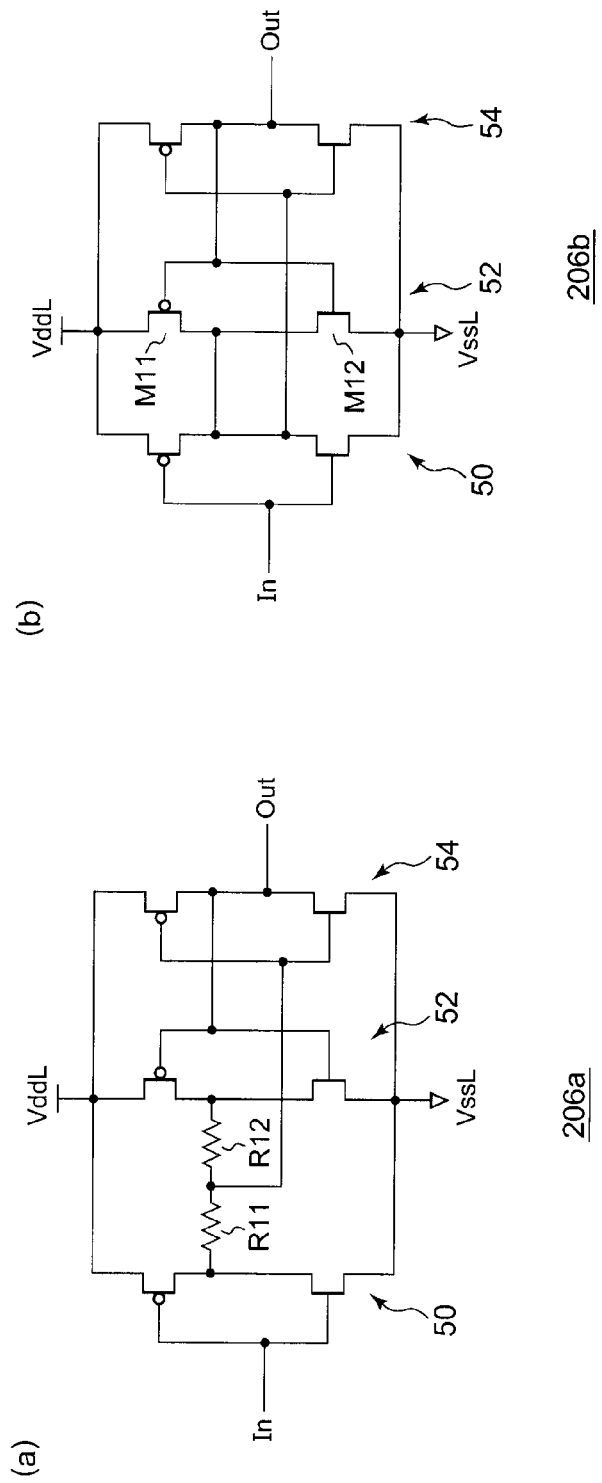
FIGS. 7A and 7B are circuit diagrams each of which shows an example configuration of a Schmitt buffer which can be employed in the level shifter shown in FIG. 1A.

FIGS. 7A and 7B are circuit diagrams each of which shows an example configuration of the Schmitt buffer 206 which can be employed in the level shifter shown in FIG. 1A or FIG. 5A. The Schmitt buffer 206a shown in FIG. 7A and the Schmitt buffer 206b shown in FIG. 7B each include three inverters 50, 52, and 54.

The input signal In is input to the first inverter 50. The output terminal of the first inverter 50 and the output terminal of the second inverter 52 are coupled by the resistors R11 and R12. The output signal of the first inverter 50 and the output signal of the second inverter 52 are divided by the resistors R11 and R12. The signal thus divided is input to the input terminal of the third inverter 54. The output of the third inverter 54 is input to the input terminal of the second inverter 52, and is output as an output signal Out to an external circuit.

The resistance value of the resistor R12 is preferably higher than that of the resistor R11. Specifically, the resistance value of the resistor R12 is preferably set to a value twice to ten times the resistance value of the resistor R11.

FIG. 7B shows an arrangement in which the resistors R11 and R12 are eliminated, and the W/L ratios (gate width/gate length) of the transistors M11 and M12 included in the second inverter 52 are each set to a value smaller than the W/L ratio of the transistors that form the first inverter 50 and the third inverter 54. That is to say, the ON resistances of the transistors M11 and M12 are each set to a higher value than those of the other transistors.

It should be noted that the configuration of the Schmitt buffer 206 is not restricted to such configurations shown in FIGS. 7A and 7B.

Figure 8:
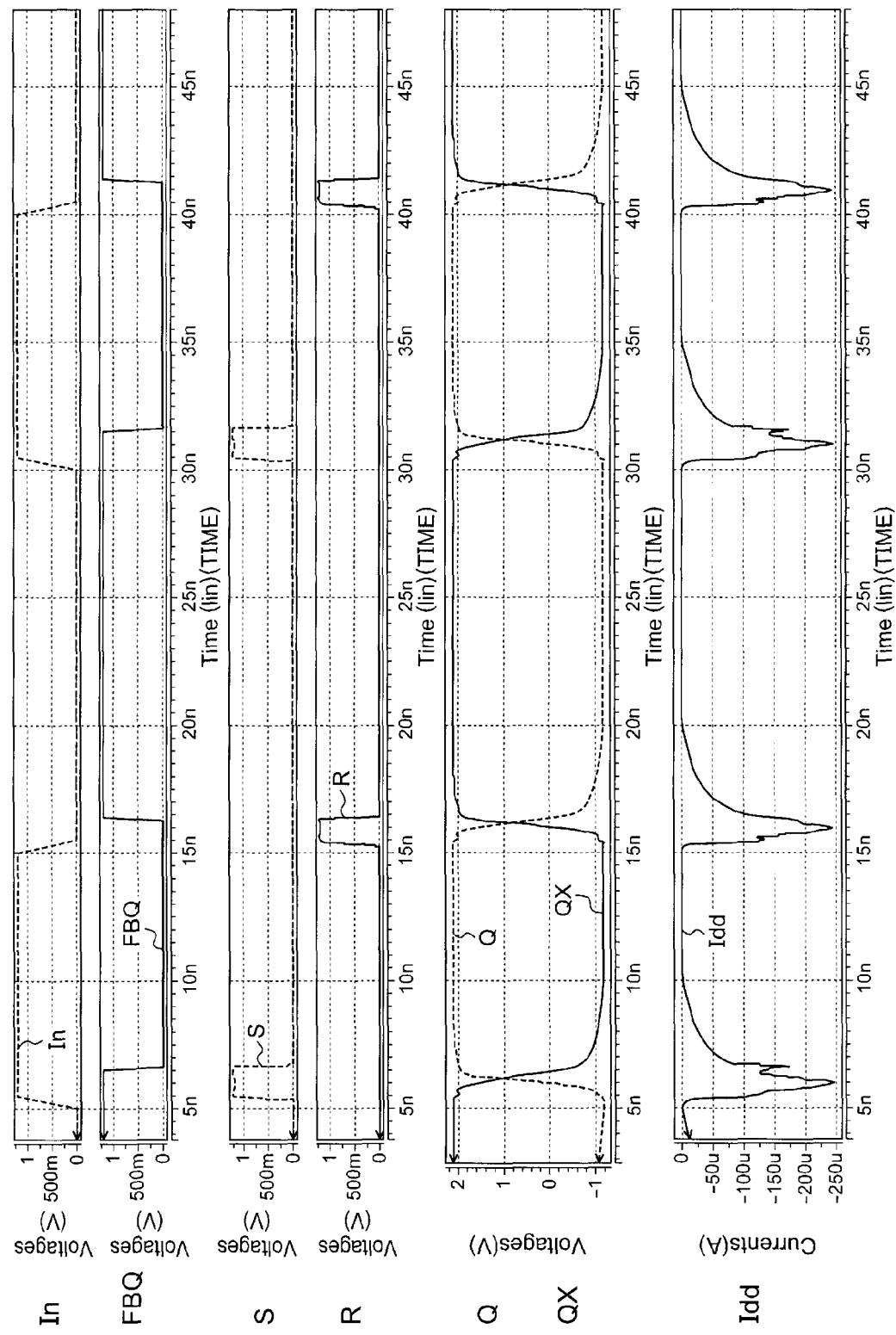
FIG. 8 is a time chart which shows the operation of the level shifter shown in FIG. 6.

The above is the configuration of the level shifter 200 employing the SR flip-flop 100. Next, description will be made regarding the operation thereof. FIG. 8 is a time chart which shows the operation of the level shifter 200d shown in FIG. 6.

As can be clearly understood from FIG. 8, the set signal S is generated by taking the logical AND of the input signal In and the feedback signal FBQ. Furthermore, the reset signal R is generated by taking the logical NOR of the input signal In and the feedback signal FBQ.

It can be understood that the SR flip-flop is operated according to the set signal S and the reset signal R, thereby outputting the output signal Q according to the input signal In. Furthermore, the amplitude of the output signal Q is an amplitude obtained by shifting the amplitude of the input signal In. Thus, it can be confirmed that the level shifter 200d functions as a level shifter.

Directing our attention to the operating current Idd, with such an arrangement employing the SR flip-flop according to the embodiment, current is consumed only at a timing at which the input signal In is switched. Thus, the power supply current Idd is almost zero in the static state. That is to say, such an arrangement reduces power consumption as compared with conventional level shifters.

Figure 9:
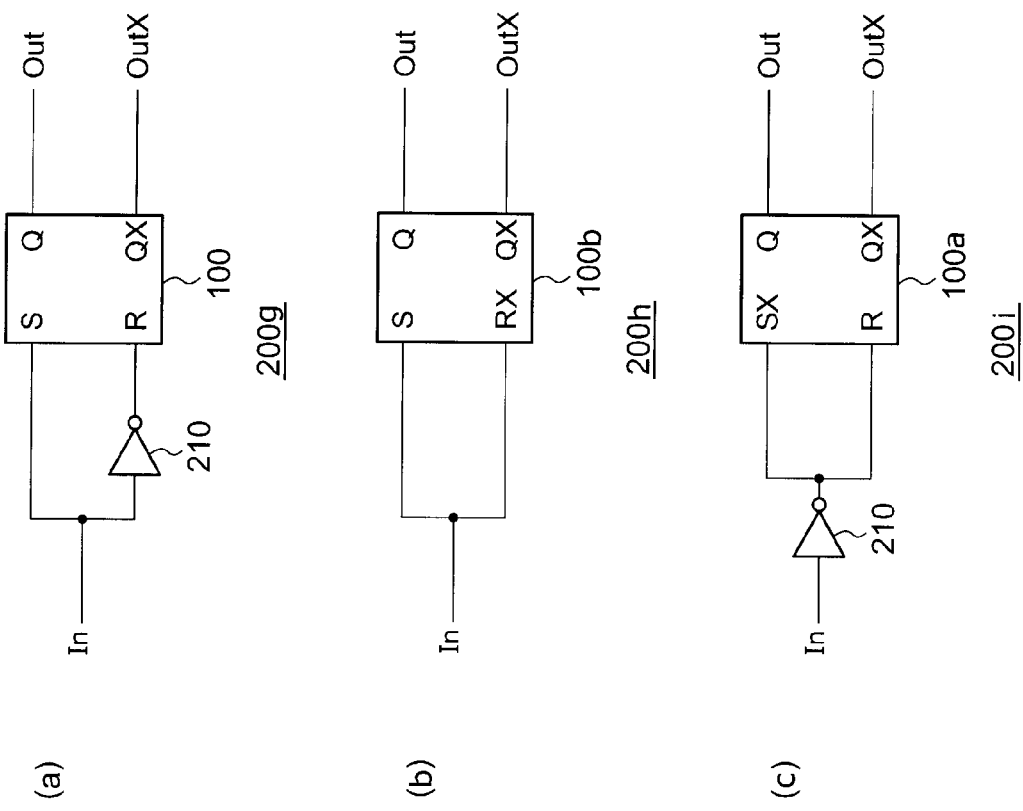
FIGS. 9A through 9C are circuit diagrams each of which shows another configuration of the level shifter circuit employing the SR flip-flop.

FIGS. 9A through 9C are circuit diagrams which show other configurations of the level shifter circuits employing the SR flip-flop.

A level shifter 200g shown in FIG. 9A includes an inverter 210 and the SR flip-flop 100 shown in FIG. 2. The inverter 210 inverts the input signal In. The input signal In and the inverted input signal are input to the set terminal and the reset terminal of the SR flip-flop 100, respectively.

The level shifter 200g shown in FIG. 9A may be modified as follows by replacing the SR flip-flop 100 by any one of the SR flip-flops shown in FIG. 4B or FIG. 4A.

Figure 10:
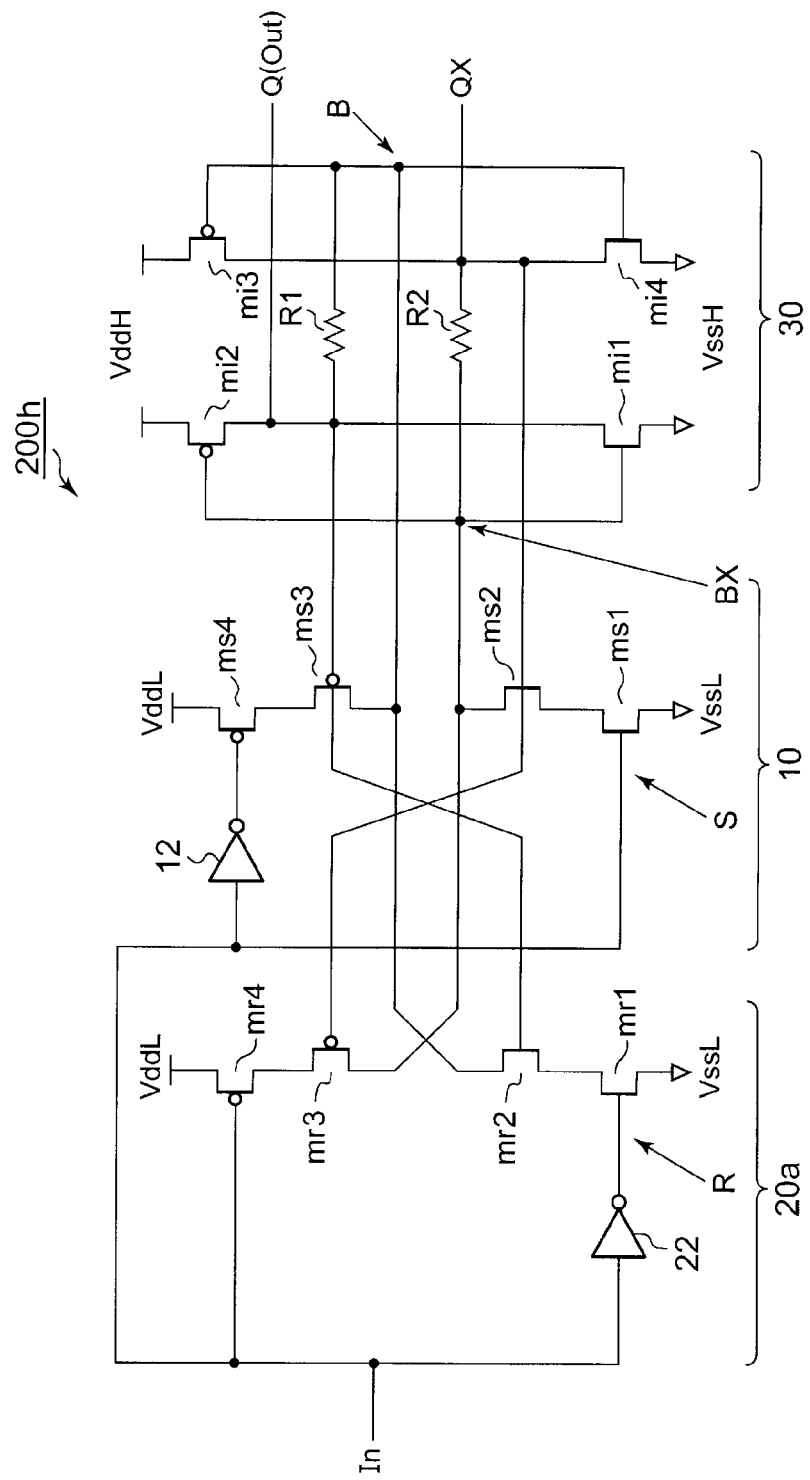
FIG. 10 is a circuit diagram which shows a specific example configuration of the level shifter circuit shown in FIG. 9A.

Modification 1. In a case in which the SR flip-flop 100b shown in FIG. 4B is employed, the inverter 210 can be eliminated. FIG. 9B shows this modification. In this case, there is no need to employ the inverter 210, thereby providing a simple circuit configuration. FIG. 10 is a circuit diagram which shows a specific configuration of a level shifter 200h shown in FIG. 9B.

Modification 2. In a case in which the SR flip-flop 100a shown in FIG. 4A is employed, the output of the inverter 210 should be input to the inverting set terminal of the SR flip-flop 100a. FIG. 9C shows this modification.

Figure 11:
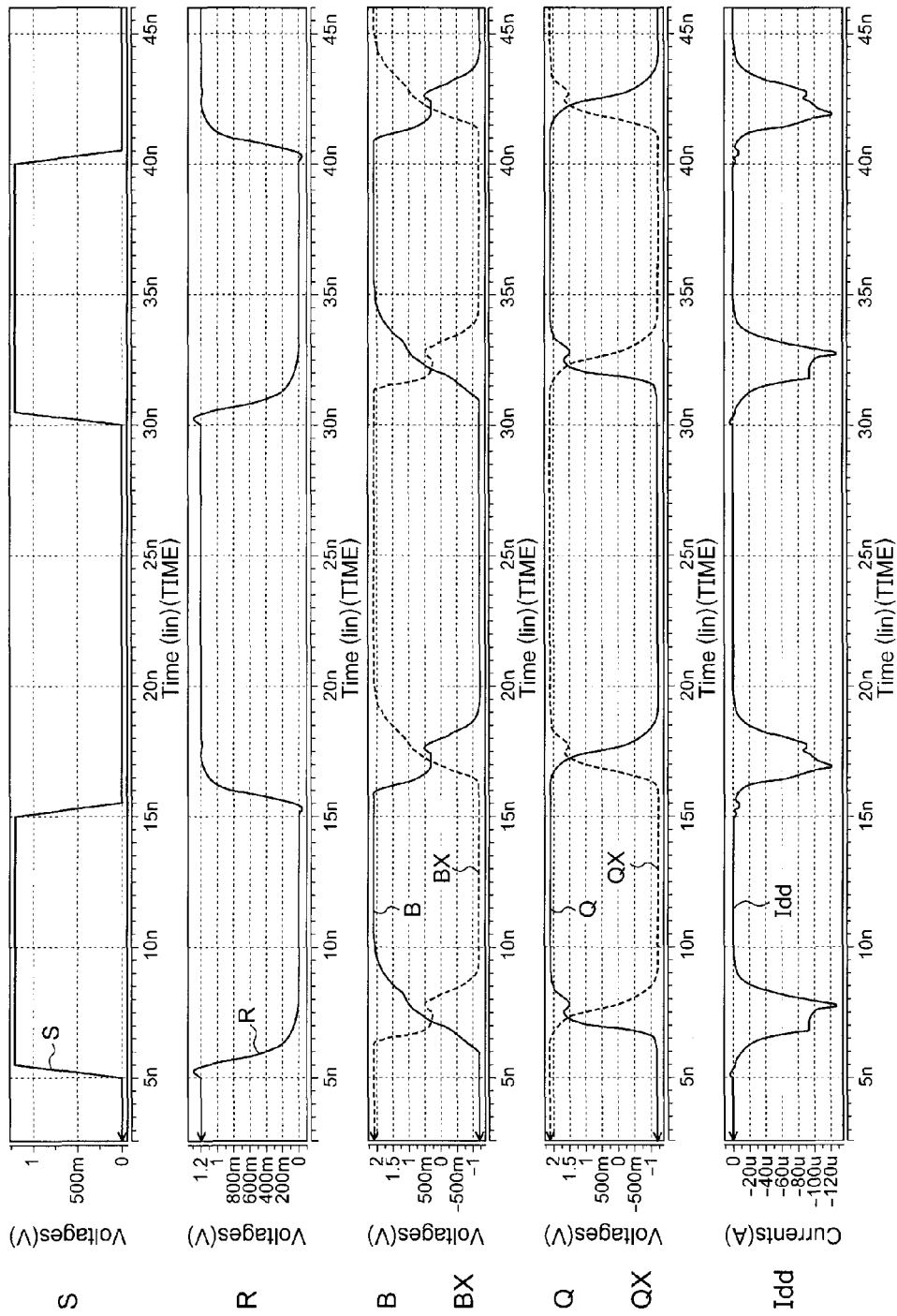
FIG. 11 is a time chart which shows the operation of the level shifter shown in FIG. 10.

FIG. 11 is a time chart which shows the operation of the level shifter 200h shown in FIG. 10. With the level shifters shown in FIGS. 9A through 9C, the amplitude can be level-shifted by passing the input signal In through the SR flip-flop 100, without using the output signal as a feedback signal as shown in FIGS. 1A through 1C.

Figure 12:
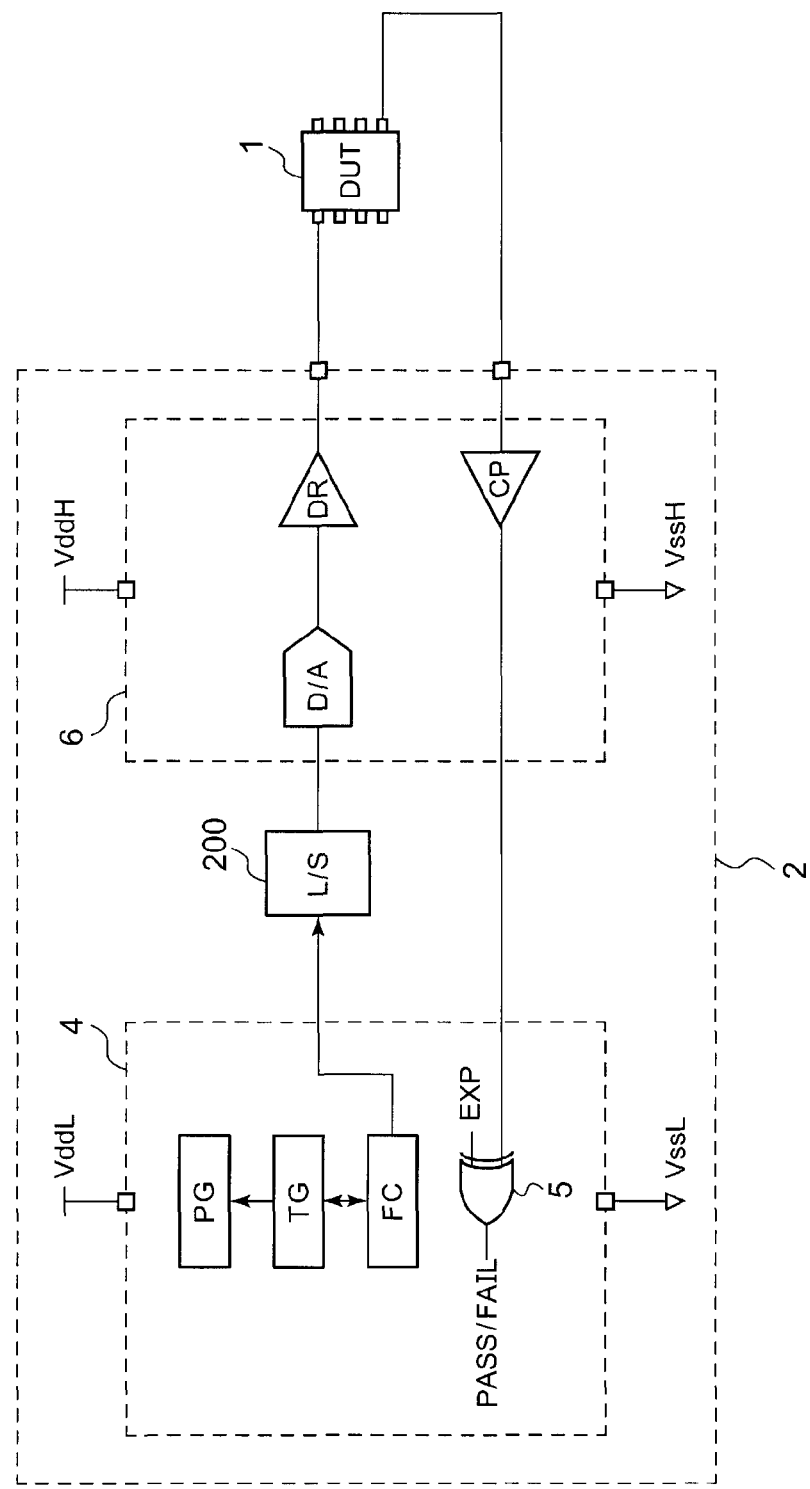
FIG. 12 is a block diagram which shows a configuration of a test apparatus including a level shifter according to an embodiment.

Lastly, description will be made regarding a suitable application of the level shifter 200 according to an embodiment. FIG. 12 is a block diagram which shows a configuration of a test apparatus including a level shifter according to an embodiment.

The test apparatus 2 supplies a test pattern signal to a DUT (device under test) 1, and judges the quality of the DUT 1 by comparing the signal output from the DUT 1 with an expected value EXP. The test apparatus 2 includes a first circuit block 4 and a second circuit block 6. The first circuit block 4 operates by receiving a first lower voltage VssL and a first upper voltage VddL, which form a voltage pair. For example, the first circuit block 4 is a block configured using a low-voltage CMOS process, and includes a timing generator TG, a pattern generator PG, a waveform shaper FC, a pass/fail judgment unit 5, memory (not shown), and so forth.

The second circuit block 6 operates by receiving a second lower voltage VssH and a second upper voltage VddH, which form a voltage pair. For example, the second circuit block 6 is an analog circuit, and includes a D/A converter, a comparator CP, a driver DR, and so forth.

The level shifter 200 described above receives signals output from the first circuit block 4, and transmits the signals thus received to the second circuit block 6. Such an arrangement employing the level shifter 200 allows signals to be reliably transmitted between circuit blocks that operate under different power supply voltages.

FIG. 12 shows only a single channel. However, an actual test apparatus 2 tests a large number of DUTs at the same time, and accordingly, such an actual test apparatus 2 includes hundreds to tens of thousands of channels. As described above, the level shifter 200 according to the embodiment has the advantage of a small power supply current Idd in the static state. By employing the level shifter 200 having the advantage of low power consumption, the power consumption of the test apparatus 2 can be reduced as compared with conventional test apparatuses.

While the preferred embodiments of the present invention have been described using specific terms, such description is for illustrative purposes only, and it is to be understood that changes and variations may be made without departing from the spirit or scope of the appended claims.

What is claimed is:

1. A level shifter configured to receive an input signal having a level set to one from among a first lower voltage and a first upper voltage which form a voltage pair, and to level-shift the input signal thus received so as to output an output signal having a level set to one from among a second lower voltage and a second upper voltage which form a voltage pair, the level shifter comprising:
an SR flip-flop configured to generate an output signal which is switched to the second upper voltage upon receiving a positive edge of a signal via a set terminal thereof, and which is switched to the second lower voltage upon receiving a positive edge of a signal via a reset terminal thereof;

a first logical gate configured to generate the logical AND of a feedback signal having the inverted logical level of the output signal of the SR flip-flop and the input signal, and to output the logical AND thus generated to the set terminal of the SR flip-flop; and a second logical gate configured to generate the logical NOR of the feedback signal and the input signal, and to output the logical NOR thus generated to the reset terminal of the SR flip-flop.

2. A level shifter configured to receive an input signal having a level set to one from among a first lower voltage and a first upper voltage which form a voltage pair, and to level-shift the input signal thus received so as to output an output signal having a level set to one from among a second lower voltage and a second upper voltage which form a voltage pair, the level shifter comprising:

an SR flip-flop configured to generate an output signal which is switched to the second upper voltage upon receiving a negative edge of a signal via an inverting set terminal thereof, and which is switched to the second lower voltage upon receiving a positive edge of a signal via a reset terminal thereof;

a first logical gate configured to generate the logical NAND of a feedback signal having the inverted logical level of the output signal of the SR flip-flop and the input signal, and to output the logical NAND thus generated to the inverting set terminal of the SR flip-flop; and a second logical gate configured to generate the logical NOR of the feedback signal and the input signal, and to output the logical NOR thus generated to the reset terminal of the SR flip-flop.

3. A level shifter configured to receive an input signal having a level set to one from among a first lower voltage and a first upper voltage which form a voltage pair, and to level-shift the input signal thus received so as to output an output signal having a level set to one from among a second lower voltage and a second upper voltage which form a voltage pair, the level shifter comprising:

an SR flip-flop configured to generate an output signal which is switched to the second upper voltage upon receiving a positive edge of a signal via a set terminal thereof, and which is switched to the second lower voltage upon receiving a negative edge of a signal via an inverting reset terminal thereof;

a first logical gate configured to generate the logical AND of a feedback signal having the inverted logical level of the output signal of the SR flip-flop and the input signal, and to output the logical AND thus generated to the set terminal of the SR flip-flop; and a second logical gate configured to generate the logical OR of the feedback signal and the input signal, and to output the logical OR thus generated to the inverting reset terminal of the SR flip-flop.

4. A level shifter configured to receive an input signal having a level set to one from among a first lower voltage and a first upper voltage which form a voltage pair, and to level-shift the input signal thus received so as to output an output signal having a level set to one from among a second lower voltage and a second upper voltage which form a voltage pair, the level shifter comprising:

an SR flip-flop configured to generate an output signal which is switched to the second upper voltage upon receiving a negative edge of a signal via an inverting set terminal thereof, and which is switched to the second lower voltage upon receiving a negative edge of a signal via an inverting reset terminal thereof;

a first logical gate configured to generate the logical NAND of a feedback signal having the inverted logical level of the output signal of the SR flip-flop and the input signal, and to output the logical NAND thus generated to the inverting set terminal of the SR flip-flop; and a second logical gate configured to generate the logical OR of the feedback signal and the input signal, and to output the logical OR thus generated to the inverting reset terminal of the SR flip-flop.

5. A level shifter according to claim 1, further comprising Schmitt buffer configured to receive the inverted output signal of the SR flip-flop, and to generate the feedback signal.

6. A level shifter according to claim 2, further comprising Schmitt buffer configured to receive the inverted output signal of the SR flip-flop, and to generate the feedback signal.

7. A level shifter according to claim 2, further comprising a delay circuit configured to receive the inverted output signal of the SR flip-flop, and to generate the feedback signal.

8. A level shifter according to claim 1, further comprising a Schmitt inverter configured to receive the output signal of the SR flip-flop, and to generate the feedback signal.

9. A level shifter according to claim 2, further comprising a Schmitt inverter configured to receive the output signal of the SR flip-flop, and to generate the feedback signal.

10. A level shifter according to claim 1, wherein the SR flip-flop comprises:

a first lower terminal to which a first lower voltage is to be applied;

a first upper terminal to which a first upper voltage is to be applied, which forms a pair with the first lower voltage;

a second lower terminal to which a second lower voltage is to be applied;

a second upper terminal to which a second upper voltage is to be applied, which forms a pair with the second lower voltage;

one of a set terminal to which a set signal is to be input and an inverting set terminal to which an inverted set signal is to be input;

one of a reset terminal to which a reset signal is to be input and an inverting reset terminal to which an inverted reset signal is to be input;

a cross-coupled inverter arranged between the second lower terminal and the second upper terminal, and configured including a first inverter and a second inverter cross-coupled such that an output terminal of each inverter is connected to an input terminal of the other inverter;

a set unit configured including a first set transistor and a second set transistor configured as N-channel MOSFETs arranged in series between the first lower terminal and the input terminal of the first inverter, and a third set transistor and a fourth set transistor configured as P-channel MOSFETs arranged in series between the input terminal of the second inverter and the first upper terminal, and configured such that the set signal is input to the gate of the first set transistor, and the signal complementary to the set signal is input to the gate of the fourth set transistor; and a reset unit configured including a first reset transistor and a second reset transistor configured as N-channel MOSFETs arranged in series between the first lower terminal and the input terminal of the second inverter, and a third reset transistor and a fourth reset transistor configured as P-channel MOSFETs arranged in series between the input terminal of the first inverter and the first upper terminal, and configured such that the reset signal is input to the gate of the first reset transistor, and the signal complementary to the reset signal is input to the gate of the fourth reset transistor, wherein the gate of the second set transistor and the gate of the third reset transistor are connected to the output terminal of the second inverter, and wherein the gate of the third set transistor and the gate of the second reset transistor are connected to the output terminal of the first inverter.

11. A level shifter according to claim 2, wherein the SR flip-flop comprises:
- a first lower terminal to which a first lower voltage is to be applied;
- a first upper terminal to which a first upper voltage is to be applied, which forms a pair with the first lower voltage;
- a second lower terminal to which a second lower voltage is to be applied;
- a second upper terminal to which a second upper voltage is to be applied, which forms a pair with the second lower voltage;
- one of a set terminal to which a set signal is to be input and an inverting set terminal to which an inverted set signal is to be input;
- one of a reset terminal to which a reset signal is to be input and an inverting reset terminal to which an inverted reset signal is to be input;
- a cross-coupled inverter arranged between the second lower terminal and the second upper terminal, and configured including a first inverter and a second inverter cross-coupled such that an output terminal of each inverter is connected to an input terminal of the other inverter;
- a set unit configured including a first set transistor and a second set transistor configured as N-channel MOSFETs arranged in series between the first lower terminal and the input terminal of the first inverter, and a third set transistor and a fourth set transistor configured as P-channel MOSFETs arranged in series between the input terminal of the second inverter and the first upper terminal, and configured such that the set signal is input to the gate of the first set transistor, and the signal complementary to the set signal is input to the gate of the fourth set transistor; and
- a reset unit configured including a first reset transistor and a second reset transistor configured as N-channel MOSFETs arranged in series between the first lower terminal and the input terminal of the second inverter, and a third reset transistor and a fourth reset transistor configured as P-channel MOSFETs arranged in series between the input terminal of the first inverter and the first upper terminal, and configured such that the reset signal is input to the gate of the first reset transistor, and the signal complementary to the reset signal is input to the gate of the fourth reset transistor,
- wherein the gate of the second set transistor and the gate of the third reset transistor are connected to the output terminal of the second inverter,
- and wherein the gate of the third set transistor and the gate of the second reset transistor are connected to the output terminal of the first inverter.

12. A level shifter configured to receive an input signal having a level set to one from among a first lower voltage and a first upper voltage which form a voltage pair, and to level-shift the input signal thus received so as to output an output signal having a level set to one from among a second lower voltage and a second upper voltage which form a voltage pair, the level shifter comprising:
- an inverter configured to receive the first lower voltage and the first upper voltage as a power supply voltage, and to invert the input signal; and
- an SR flip-flop configured to receive the input signal via a set terminal thereof, to receive, via a reset terminal thereof, the inverted input signal thus inverted by the inverter, and to generate an output signal which is switched to the second upper voltage upon receiving a positive edge of the signal via the set terminal thereof, and which is switched to the second lower voltage upon receiving a positive edge of the signal via the reset terminal thereof; wherein the SR flip-flop comprises:
- a first lower terminal to which a first lower voltage is to be applied;
- a first upper terminal to which a first upper voltage is to be applied, which forms a pair with the first lower voltage;
- a second lower terminal to which a second lower voltage is to be applied;
- a second upper terminal to which a second upper voltage is to be applied, which forms a pair with the second lower voltage;
- one of a set terminal to which a set signal is to be input and an inverting set terminal to which an inverted set signal is to be input;
- one of a reset terminal to which a reset signal is to be input and an inverting reset terminal to which an inverted reset signal is to be input;
- a cross-coupled inverter arranged between the second lower terminal and the second upper terminal, and configured including a first inverter and a second inverter cross-coupled such that an output terminal of each inverter is connected to an input terminal of the other inverter;
- a set unit configured including a first set transistor and a second set transistor configured as N-channel MOSFETs arranged in series between the first lower terminal and the input terminal of the first inverter, and a third set transistor and a fourth set transistor configured as P-channel MOSFETs arranged in series between the input terminal of the second inverter and the first upper terminal, and configured such that the set signal is input to the gate of the first set transistor, and the signal complementary to the set signal is input to the gate of the fourth set transistor; and
- a reset unit configured including a first reset transistor and a second reset transistor configured as N-channel MOSFETs arranged in series between the first lower terminal and the input terminal of the second inverter, and a third reset transistor and a fourth reset transistor configured as P-channel MOSFETs arranged in series between the input terminal of the first inverter and the first upper terminal, and configured such that the reset signal is input to the gate of the first reset transistor, and the signal complementary to the reset signal is input to the gate of the fourth reset transistor,
- wherein the gate of the second set transistor and the gate of the third reset transistor are connected to the output terminal of the second inverter,
- and wherein the gate of the third set transistor and the gate of the second reset transistor are connected to the output terminal of the first inverter.

13. A level shifter configured to receive an input signal having a level set to one from among a first lower voltage and a first upper voltage which form a voltage pair, and to level-shift the input signal thus received so as to output an output signal having a level set to one from among a second lower voltage and a second upper voltage which form a voltage pair, the level shifter comprising an SR flip-flop configured to receive the input signal via a set terminal and an inverting reset terminal thereof, and to generate an output signal which is switched to the second upper voltage upon receiving a positive edge of the signal via the set terminal thereof, and which is switched to the second lower voltage upon receiving a negative edge of the signal via the inventing reset terminal thereof; wherein the SR flip-flop comprises:
a first lower terminal to which a first lower voltage is to be applied;
a first upper terminal to which a first upper voltage is to be applied, which forms a pair with the first lower voltage;
a second lower terminal to which a second lower voltage is to be applied;
a second upper terminal to which a second upper voltage is to be applied, which forms a pair with the second lower voltage;
one of a set terminal to which a set signal is to be input and an inverting set terminal to which an inverted set signal is to be input;
one of a reset terminal to which a reset signal is to be input and an inverting reset terminal to which an inverted reset signal is to be input;
a cross-coupled inverter arranged between the second lower terminal and the second upper terminal, and configured including a first inverter and a second inverter cross-coupled such that an output terminal of each inverter is connected to an input terminal of the other inverter;
a set unit configured including a first set transistor and a second set transistor configured as N-channel MOSFETs arranged in series between the first lower terminal and the input terminal of the first inverter, and a third set transistor and a fourth set transistor configured as P-channel MOSFETs arranged in series between the input terminal of the second inverter and the first upper terminal, and configured such that the set signal is input to the gate of the first set transistor, and the signal complementary to the set signal is input to the gate of the fourth set transistor; and
a reset unit configured including a first reset transistor and a second reset transistor configured as N-channel MOSFETs arranged in series between the first lower terminal and the input terminal of the second inverter, and a third reset transistor and a fourth reset transistor configured as P-channel MOSFETs arranged in series between the input terminal of the first inverter and the first upper terminal, and configured such that the reset signal is input to the gate of the first reset transistor, and the signal complementary to the reset signal is input to the gate of the fourth reset transistor,
wherein the gate of the second set transistor and the gate of the third reset transistor are connected to the output terminal of the second inverter,
and wherein the gate of the third set transistor and the gate of the second reset transistor are connected to the output terminal of the first inverter.

14. A level shifter configured to receive an input signal having a level set to one from among a first lower voltage and a first upper voltage which form a voltage pair, and to level-shift the input signal thus received so as to output an output signal having a level set to one from among a second lower voltage and a second upper voltage which form a voltage pair, the level shifter comprising:

an inverter configured to invert the input signal; and
an SR flip-flop configured to receive, via the inverting set terminal and the reset terminal thereof, the inverted input signal thus inverted by the inverter, and to generate an output signal which is switched to the second upper voltage upon receiving a negative edge of the signal via the inverting set terminal thereof, and which is switched to the second lower voltage upon receiving a positive edge of the signal via the reset terminal thereof; wherein the SR flip-flop comprises:
a first lower terminal to which a first lower voltage is to be applied;
a first upper terminal to which a first upper voltage is to be applied, which forms a pair with the first lower voltage;
a second lower terminal to which a second lower voltage is to be applied;
a second upper terminal to which a second upper voltage is to be applied, which forms a pair with the second lower voltage;
one of a set terminal to which a set signal is to be input and an inverting set terminal to which an inverted set signal is to be input;
one of a reset terminal to which a reset signal is to be input and an inverting reset terminal to which an inverted reset signal is to be input;
a cross-coupled inverter arranged between the second lower terminal and the second upper terminal, and configured including a first inverter and a second inverter cross-coupled such that an output terminal of each inverter is connected to an input terminal of the other inverter;
a set unit configured including a first set transistor and a second set transistor configured as N-channel MOSFETs arranged in series between the first lower terminal and the input terminal of the first inverter, and a third set transistor and a fourth set transistor configured as P-channel MOSFETs arranged in series between the input terminal of the second inverter and the first upper terminal, and configured such that the set signal is input to the gate of the first set transistor, and the signal complementary to the set signal is input to the gate of the fourth set transistor; and
a reset unit configured including a first reset transistor and a second reset transistor configured as N-channel MOSFETs arranged in series between the first lower terminal and the input terminal of the second inverter, and a third reset transistor and a fourth reset transistor configured as P-channel MOSFETs arranged in series between the input terminal of the first inverter and the first upper terminal, and configured such that the reset signal is input to the gate of the first reset transistor, and the signal complementary to the reset signal is input to the gate of the fourth reset transistor,
wherein the gate of the second set transistor and the gate of the third reset transistor are connected to the output terminal of the second inverter,
and wherein the gate of the third set transistor and the gate of the second reset transistor are connected to the output terminal of the first inverter.

15. A test apparatus comprising:
a first circuit block configured to operate by receiving a first lower voltage and a first upper voltage, which form a voltage pair;
a second circuit block configured to operate by receiving a second lower voltage and a second upper voltage, which form a voltage pair; and shifter according to claim 1, configured to receive a signal output from the first circuit block, and to transmit the signal thus received to the second circuit block.

16. A test apparatus comprising:

a first circuit block configured to operate by receiving a first lower voltage and a first upper voltage, which form a voltage pair;

a second circuit block configured to operate by receiving a second lower voltage and a second upper voltage, which form a voltage pair; and shifter according to claim 2, configured to receive a signal output from the first circuit block, and to transmit the signal thus received to the second circuit block.

* * * * *